(12) United States Patent
Hunter et al.

(10) Patent No.: US 6,974,604 B2
(45) Date of Patent: Dec. 13, 2005

(54) METHOD OF SELF-LATCHING FOR ADHESION DURING SELF-ASSEMBLY OF ELECTRONIC OR OPTICAL COMPONENTS

(75) Inventors: Andrew T. Hunter, Woodland Hills, CA (US); Peter D. Brewer, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 42 days.

(21) Appl. No.: 10/218,053

(22) Filed: Aug. 12, 2002

(65) Prior Publication Data

US 2003/0062123 A1 Apr. 3, 2003

Related U.S. Application Data

(60) Provisional application No. 60/326,056, filed on Sep. 28, 2001.

(51) Int. Cl.$^7$ .................................................. B05D 3/10
(52) U.S. Cl. ..................... 427/301; 427/197; 427/201; 427/212; 427/302
(58) Field of Search ................................ 427/180, 197, 427/201, 212, 261, 301, 302, 333

(56) References Cited

U.S. PATENT DOCUMENTS

| | | | |
|---|---|---|---|
| 4,800,459 A | 1/1989 | Takagi et al. | 361/321 |
| 4,912,844 A | 4/1990 | Parker | 29/848 |
| 5,032,896 A | 7/1991 | Little et al. | 357/35 |

(Continued)

FOREIGN PATENT DOCUMENTS

| | | |
|---|---|---|
| EP | 0 982 385 A1 | 3/2000 |
| JP | 10-022338 | 1/1998 |
| WO | 01/33300 A2 | 5/2001 |

OTHER PUBLICATIONS

Bains, Sunny, "Double Helix Doubles as Engineer," Science, vol. 279, Iss. 5359, pp. 2043–2044.*
Bains, Sunny, "Circuit Blocks Attached via DNA," Electronic Engineering Times, Mar. 9, 1998, pp. 39 and 44.*
Böhringer et al., "Modeling of Fluidic Forces and Binding Sites for Fluidic Self–Assembly," IEEE Conference on Micro Electro Mechanical Systems (MEMS), pp. 369–374, Interlaken, Switzerland, Jan. 21–25, 2001.*
Hao et al., "Buildup of Polymer/Au Nanoparticle Multilayer Thin Films Based on Hydrogen Bonding," Chem. Mater. 2000, 12, 3392–3396.*
Kumar et al., "Patterning Self–Assembled Monolayers: Applications in Materials Science," Langmuir 1994, 10, 1498–1511.*
U.S. Appl. No. 10/888,169, filed Jul. 8, 2004, Brewer.

(Continued)

Primary Examiner—Timothy Meeks
Assistant Examiner—William Phillip Fletcher, III
(74) Attorney, Agent, or Firm—Ladas & Parry LLP

(57) ABSTRACT

A method for assembling components on a substrate including the steps of: (a) selectively coating at least a first receptor site of the substrate with a liquid precursor that forms a solid adhesive upon contact with an initiator; (b) providing each of the components with an adhesion surface that has the initiator; and (c) depositing the components on the substrate in a manner that causes a first of the components to contact the at least first receptor site whereupon contact between the initiator and the liquid precursor causes formation of the adhesive which affixes the first compound to the first receptor site. In a preferred embodiment of the invention, the precursor is a liquid monomer and the initiator initiates a polymerization reaction upon contact with the monomer to form a solid polymer.

22 Claims, 4 Drawing Sheets

U.S. PATENT DOCUMENTS

| | | | |
|---|---|---|---|
| 5,065,277 A | 11/1991 | Davidson | 361/383 |
| 5,161,093 A | 11/1992 | Gorczyca et al. | 361/414 |
| 5,284,548 A | 2/1994 | Carey et al. | 156/630 |
| 5,312,765 A | 5/1994 | Kanber | 437/22 |
| 5,353,498 A | 10/1994 | Fillion et al. | 29/840 |
| 5,426,563 A | 6/1995 | Moresco et al. | 361/689 |
| 5,485,038 A | 1/1996 | Licari et al. | 257/758 |
| 5,545,291 A | 8/1996 | Smith et al. | 156/655.1 |
| 5,609,907 A * | 3/1997 | Natan | 427/2.12 |
| 5,751,018 A * | 5/1998 | Alivisatos et al. | 257/64 |
| 5,772,905 A | 6/1998 | Chou | 216/44 |
| 5,783,856 A | 7/1998 | Smith et al. | 257/618 |
| 5,800,650 A | 9/1998 | Anderson et al. | 156/150 |
| 5,824,186 A | 10/1998 | Smith et al. | 156/655.1 |
| 5,877,550 A | 3/1999 | Suzuki | 257/700 |
| 5,904,545 A * | 5/1999 | Smith et al. | 438/455 |
| 6,037,255 A | 3/2000 | Hussein et al. | 438/675 |
| 6,096,386 A * | 8/2000 | Biebuyck et al. | 427/510 |
| 6,165,911 A | 12/2000 | Calveley | 438/754 |
| 6,166,438 A | 12/2000 | Davidson | 257/725 |
| 6,294,741 B1 | 9/2001 | Cole, Jr. et al. | 174/260 |
| 6,326,058 B1 * | 12/2001 | Biebuyck et al. | 427/261 |
| 6,500,694 B1 | 12/2002 | Enquist | 438/109 |
| 6,541,346 B2 | 4/2003 | Malik | 438/316 |
| 6,579,463 B1 * | 6/2003 | Winningham et al. | 216/41 |
| 6,652,808 B1 * | 11/2003 | Heller et al. | 422/68.1 |
| 6,656,568 B1 * | 12/2003 | Winningham et al. | 428/145 |
| 2002/0045030 A1 * | 4/2002 | Ozin et al. | 428/173 |
| 2003/0068519 A1 | 4/2003 | Brewer et al. | 428/620 |
| 2003/0112576 A1 | 6/2003 | Brewer et al. | 361/119 |
| 2003/0140317 A1 | 7/2003 | Brewer et al. | 716/1 |

OTHER PUBLICATIONS

Böhringer, K.F., et al., "Modeling of Capillary Forces and Binding Sites For Fluidic Self–Assembly," *MEMS: 2001: The 14th IEEE International Conference on Micro Electro Mechanical Systems*, pp. 369–374 (2001).

Cohn, M.B., et al., "Microassembly Technologies For MEMS," *SPIE Micromachining and Microfabrication, Conference on Micromachining and Microfabrication Process Technology IV*, Santa Clara, CA, 15 pages total (Sep. 21–22, 1998).

Gracias, D.H., "Forming Electrical Networks In Three Dimensions by Self–Assembly," *Science*, vol. 289, pp. 1170–1172 (Aug. 18, 2000).

Hadley, M.A., "Vertical–Cavity Surface–Emitting Laser Diodes: Design, Growth, Mode Control and Integration by Fluidic Self–Assembly," *UMI Dissertation Services*, Sections 5.4, 5.5, and 5.6, pp. 75–81 (1994).

Saitou, K., et al., "Externally Resonated Linear Microvibramotor For Microassembly," *Journal of Microelectromechanical Systems*, vol. 9, No. 3, pp. 336–346 (Sep. 2000).

Borzenko, T., et al., "Polymer bonding process for nanolithography," *Applied Physics Letters*, vol. 79, No. 14, pp 2246–2248 (Oct. 1, 2001).

Chou, S.Y., et al., "Imprint of sub–25 nm vias and trenches in polymers," *Appl. Phys. Lett.*, vol. 67, No. 21, pp 3114–3116 (Nov. 20, 1995).

Chou, S.Y., et al., "Nanoimprint lithography," *J. Vac. Sci. Technol. B*, vol. 14, No. 6, pp 4129–4133 (Nov./Dec. 1996).

Tormen, M., et al., "Thermocurable polymers as resists for imprint lithography," *Electronics Letters*, vol. 36, No. 11, pp 983–984 (May 25, 2000).

Zhang, W., et al., "Multilevel nanoimprint lithography with submicron alignment over 4 in. Si wafers," *Applied Physics Letters*, vol. 79, No. 6, pp 845–847 (Aug. 6, 2001).

Bobbio, S.M., et al., "Integrated Force Arrays," *IEEE Proceedings of the Workshop on Micro Electro Mechanical Systems (MEMS)*, Fort Lauderdale, pp 149–154 (Feb. 7–10, 1993).

Srinivasan, U., et al., "Fluidic Self–Assembly of Micromirrors onto Surface Micromachined Actuators," *IEEE*, pp 59–60, (2000).

Srinivasan, U., et al., "Microstructure to Substrate Self–Assembly Using Capillary Forces," *Journal of Microelectromechanical Systems*, vol. 10, No. 1, pp 17–24 (Mar. 2001).

Chou, Stephen Y., et al, "Imprint of Sub–25 NM Vias and Trenches in Polymers," *Applied Physics Lett.*, American Institute of Physics, vol. 67, No. 21, pp. 3114–3116 (Nov. 20, 1995).

Chou, Stephen Y., et al, "Nanoimprint Lithography," *J. Vac. Sci. Technol. B*, American Vacuum Society, vol. 14, No. 6, pp. 4129–4133 (Nov./Dec. 1996).

Terfort, Andreas, et al, "Self–Assembly Of An Operating Electrical Circuit Based On Shape Complementarity And The Hydrophobic Effect," *Advanced Materials*, vol. 10, No. 6, pp. 470–473, (1998).

"Use of High Precision Silicon Molds for Replicating Microelectronic Packaging Structures," *IBM Technical Disclosure Bulletin*, vol. 30, No. 5, pp 306–311 (Oct. 1987).

"Method to Control the Geometry and Vertical Profile of Via Holes in Substrate Materials," *IBM Technical Disclosure Bulletin*, vol. 35, No. 5, pp 211–216 (Oct. 1992).

Terfort, A., et al., "Three–dimensional self–assembly of millimetre–scale components," *Nature*, vol. 386, pp 162–164 (Mar. 13, 1997).

* cited by examiner

METHOD OF SELF-LATCHING FOR ADHESION DURING SELF-ASSEMBLY OF ELECTRONIC OR OPTICAL COMPONENTS

CLAIM OF BENEFITS OF PROVISIONAL APPLICATION

Applicants claim the benefits of their co-pending U.S. Provisional application Ser. No. 60/326,056, filed on 28 Sep. 2001.

STATEMENT OF GOVERNMENT INTEREST

This invention was made with government support under Spawarn Contract No. N66001-98-C-8621. The government has certain rights in this invention.

FIELD OF THE INVENTION

This invention relates lo a method for self-assembly of microstructures. In particular the invention relates to the self-assembly and adhesion of components to microstructures More particularly the invention relates to permanent affixing of the components to the microstructures during the self-assembly step.

BACKGROUND OF THE INVENTION

In self-assembly processes, components can be made to assemble without specifically placing the components in a particular configuration. The components assemble in a particular configuration because the desired configuration is the lowest energy state available to the system.

Terfort et al. (Three-dimensional self-assembly of millimetre scale components, Nature Vol 386, Mar. 13, 1997 pgs. 162–164) describe a process for self-assembly of microstructures by creating hydrophilic and hydrophobic surfaces. The hydrophobic surfaces adhere to one another and a liquid acts as a lubricant allowing the components to adjust their position to one another by lateral movement. The components can be wet with a photopolymerizable adhesive. After the system approaches equilibrium, the system is exposed to ultraviolet irradiation and the components are affixed into permanent form U.S. Pat. No. 5,824,186 and related patents describe the use of a eutectic layer (gold, silver, solder) for bonding through a heating step that is subsequent to the transferring step.

The prior art also describes methods to accomplish the locking in of self-located objects which involve for example, the use of a UV polymerizable adhesive, use of a metal solder with the assembly done at a temperature high enough to melt the solder, or use of polymeric coatings for assembly that are hardened through heating or freezing the components in place. In each of these methods, after the self-location assembly step is complete, a further processing step must be carried out to lock the objects permanently in place. For the UV polymerizable adhesive, the system must be exposed to UV light for some period of time, and the assembly objects and coatings must be transparent to UV wavelengths. For systems which use solder, the system must be cooled to below the melting temperature of the solder. For thermally polymerized systems, the adhesive can be hardened only after assembly is complete.

The inventors are not aware of any system for self-assembly where the permanent adhesion occurs during the assembly process. The inventors are also not aware of any other technique that allows for the selective hardening of an adhesive as each individual part or component is located in or on an appropriate location of a substrate.

SUMMARY OF THE INVENTION

The present invention relates to a method for assembling objects onto a substrate. In particular the method involves self-assembly whereby an object is affixed to a substrate. More particularly, the method involves self-assembly and affixing of an object to a receptacle on or in a substrate. An advantage of the present invention is that, once the object is self-located on the substrate or on or in a receptacle site on the substrate, no other step is needed to cause the object to be affixed permanently to the substrate or receptacle. For purposes of this application, the terms "self-locates", "self-assembly" and "self-assembles" may be used interchangeably.

In accordance with the invention, there is provided a method for assembling components on a substrate comprising the steps of: (a) selectively coating at least a first receptor site of the substrate with a precursor that forms a solid adhesive upon contact with an initiator; (b) providing each of the components with an adhesion surface that comprises the initiator; and (c) depositing the components on the substrate in a manner that causes a first of the components to contact the at least first receptor site whereupon contact between the initiator and the liquid precursor causes formation of the adhesive which affixes the first compound to the first receptor site.

In one embodiment of the invention, step (c) comprises depositing a slurry comprising a carrier fluid and a plurality of the components onto the substrate, the precursor and the initiator being immiscible with the carrier fluid, the adhesion surface of the component having a lower surface energy in the precursor than in the carrier fluid. The first receptor site can have a surface that is hydrophilic with an area around the first receptor site being hydrophobic, or the first receptor site can have a surface that is hydrophobic with the area around the first receptor site being hydrophilic. The adhesion surface of each of the components comprises a hydrophilic material that is attracted to the surface of the first receptor site if the surface of the first receptor site is hydrophilic. The adhesion surface of each of the components comprises a hydrophobic material that is attracted to the surface of the first receptor site if the surface of the first receptor site is hydrophobic. In a preferred embodiment of the invention, the surface of the first receptor site is hydrophilic and the area around the first receptor site is hydrophobic, the adhesion surface of each of the components comprising the hydrophilic material.

In another preferred embodiment of the invention, the precursor is a liquid monomer and the initiator initiates a polymerization reaction upon contact with the monomer to form a solid polymer. The precursor can be, for example, an epoxide monomer and the initiator can be a base that initiates a polymerization reaction upon contact with the monomer to form the solid polymer. Alternatively, the precursor can be, for example, a liquid cyanoacrylate monomer with the initiator comprising a weak base that upon contact with the monomer initiates a polymerization reaction to form a solid polymer. The weak base may be selected from molecules containing a functional group selected from ammonia, an amine, an alcohol or an ether. The invention comprises, in a preferred embodiment, coating said initiator onto the surface of the components by depositing a gold film on the components and then applying an alkyl compound of the formula $HS(CH_2)_nX$, wherein $X=NH_2$ or OH and $n=5-20$, to the gold film to form a gold surface that is functionalized with an amine or alcohol moiety.

In yet another preferred embodiment of the invention, step (a) comprises providing said substrate with a plurality of receptacles that are separated from one another by regions, treating the plurality of receptacles to render them hydrophilic and treating the regions to render them hydrophobic. The precursor is preferably a polar fluid and step (a) preferably comprises depositing the polar fluid and an assembly fluid onto a surface of the substrate so that the polar fluid preferentially wets the hydrophilic receptacles and then removing excess polar fluid from the surface of the substrate.

The method of this invention can be used to manufacture products in which many objects of the same kind must be placed and accurately aligned on a substrate. It is an inherently parallel process. The method of this invention can be used but it is not limited to use in electronic systems in which flip chip bonding is used for assembly of microstructures, for the placement of infrared detector pixels or sub-arrays on curved substrates, for the placement of individual send and receive modules on a large substrate for phased array antennas or for curved detector arrays.

DETAILED DESCRIPTION

Figure 1:
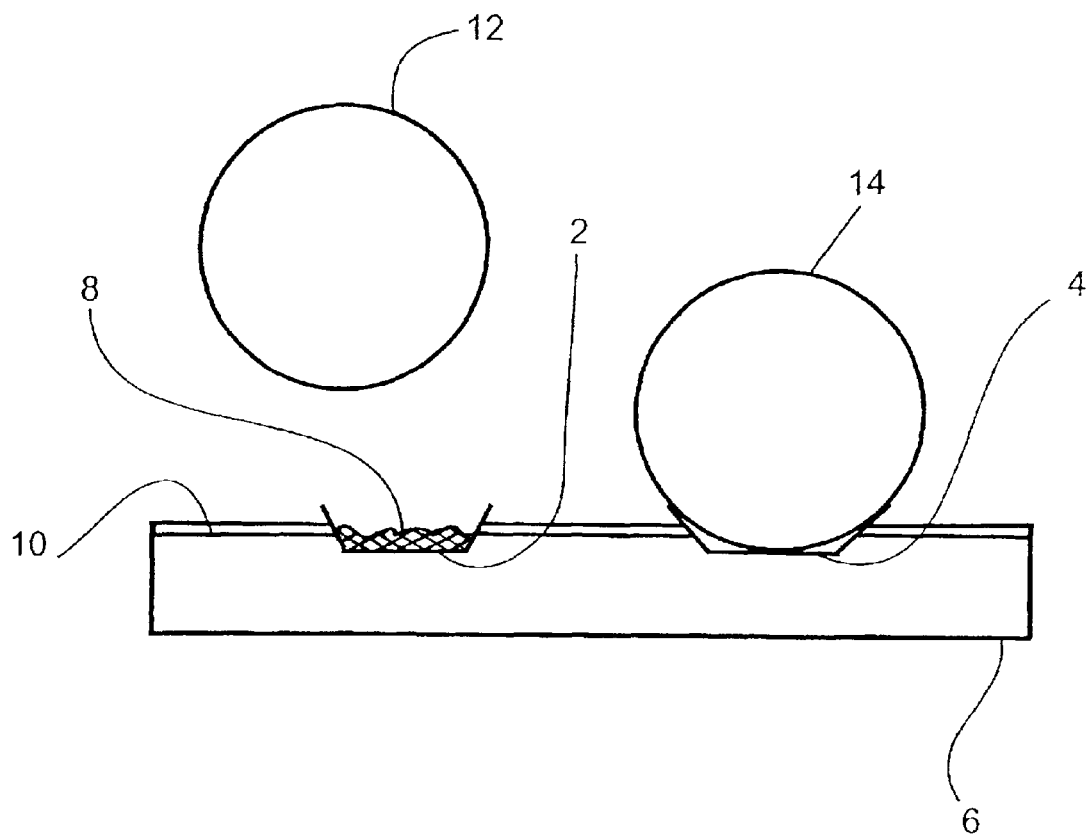
FIG. 1 is a schematic of an assembly process according to the invention.

According to the method of the present invention an object self-assembles to a substrate as a result of forces between the object and the substrate. In a preferred embodiment of the invention, the object self-assembles to a receptacle on the substrate. As used herein, a "receptacle" is used interchangeably with "receptacle site" or "receptacle region" and is defined by the property that it preferentially wets with the precursor. It may be formed by lithographic and/or chemical techniques that produce a local area that is either hydrophilic or hydrophobic, and is surrounded by a substrate area that is either hydrophobic or hydrophilic, respectively. It may be a recess, it may be essentially flat with respect to the substrate, or it may even be raised from the substrate.

The receptacles on the substrate are formed by methods known in the art such as etching masking, or selective coating. Once the receptacles are formed, the substrate is treated so that the receptacle is hydrophilic and the areas surrounding the receptacle are hydrophobic or vice versa. The terms "assembly fluid" or "carrier fluid" are used interchangeably to identify the fluid used around the receptacles and other terms can be used to identify these fluids.

In a preferred embodiment of the invention, hydrophilic coatings are used on the receptacles and on adhesion surfaces of the objects. In this connection, an object may have one surface or side that is intended to be the surface that contacts or adheres to the receptor site. The term "adhesion surface" is used herein to denote this surface. To insure that only the adhesion surface sticks to the receptacle, in a preferred embodiment of the invention the adhesion surface should have a hydrophilic coating, while the non-adhering surfaces should have hydrophobic coatings (if two polar materials are used for the adhesive, in a non-polar assembly fluid). This insures that the correct surface adheres to the receptacle. (In another embodiment of the invention, wherein a non-polar precursor and initiator are used in a polar assembly fluid, the adhesion surfaces should be hydrophobic, and other surfaces on the object should be hydrophilic). In the preferred embodiment, the adhesion surface of an object to be affixed to the receptacle or substrate is coated with a hydrophilic material. A different hydrophilic material is applied to the receptacle. The self-location of the object in its correct position, such as in the receptacle, initiates the process which affixes the object in place. Self-assembly of the object to the substrate occurs because of the lowering of the interfacial energy between the hydrophilic coating and the hydrophilic material on the substrate or receptacle.

When hydrophilic coatings are used on the receptacles and on the adhesion surfaces of the objects, all non-adhering surfaces should be made hydrophobic. This allows the use of polar materials for the two part adhesive. An alternative embodiment is to use hydrophobic coatings for the receptacle and the adhesion surface of the object, with hydrophilic coatings on surrounding surfaces. This requires the use of non-polar adhesives.

The formation of receptacles can be done by a number of techniques. The key attribute of a receptacle in a preferred embodiment of this invention is that it is hydrophilic while the surrounding substrate is hydrophobic. This property causes the receptacle to be wet selectively by the polar adhesive when the substrate is immersed in the non-polar assembly fluid. There are many ways known to those of skill in the art of making a surface hydrophilic or hydrophobic. The invention employs methods for rendering one area hydrophilic, which methods are compatible with the steps needed to make the adjacent area hydrophobic. One example is to pattern Au on Si by standard techniques, oxidize exposed Si using a hydrogen peroxide treatment (to make the Si surfaces hydrophilic), then to soak the Au surfaces in a thiol/alcohol mixture to render the Au surfaces hydrophobic. The oxidized Si regions stay hydrophilic through the thiol/alcohol treatment.

Another possibility for making hydrophilic receptacles on an otherwise hydrophobic substrate is to use an Imidex film, i e., a polyimide thermoplastic (Imidex is a registered trademark of General Electric Company Corporation). As received, this material is hydrophobic. After exposure to an oxygen plasma, the material becomes hydrophilic. The inventors have used standard lithographic techniques to protect the substrate from the plasma with patterned photoresist, so that only the receptacles are exposed. The inventors have verified that the plasma exposure makes the receptacles hydrophilic, while leaving the remainder of the substrate hydrophobic.

There are a number of trichlorosilane compounds with organic end groups that can be used to make Si or glass surfaces hydrophilic or hydrophobic, depending on whether the end group is polar or non-polar (respectively). Those of skill in the art could routinely pattern coatings of this type to create receptacles on a substrate.

In co-pending application Ser. No. 10/218,052 filed on the same date as the present application and entitled "Method for Assembly of Complementary-Shaped Receptacle Site and Device Microstructures" (the contents of which are hereby incorporated herein by reference), inventors P. D. Brewer, A. T. Hunter and L. M. Deckard describe receptacles that can be used in self-assembly in which the objects and the receptacles are matched in shape. In that invention, three-dimensional shape matching drives location of the object onto the receptacle. The method comprises (a) providing a plurality of microstructure components with each of the components having a bottom with the same three dimensional shape; (b) forming a mold with at least one protuberance from a surface thereof so that the at least one protuberance has the same shape; (c) molding a moldable substrate with the mold to form a molded substrate having a surface with at least one recess having the same shape; and (d) positioning a first of the plurality of microstructure components into said at least one recess. The positioning step may consist of mixing the microstructure components with a fluid to form a slurry; and depositing the slurry on the surface of the molded substrate to cause the first of the plurality of microstructure components to self-align in the recess. While the present invention does not require the use of a three-dimensionally shaped receptacle, the techniques of the present and co-pending applications can be used together to improve the yield of the assembly operation.

In a preferred embodiment of the invention, a two part adhesive system is used in which the initiator or hardener is transported on the small objects or components in an assembly or carrier fluid. The main requirements for these two-part systems in the preferred embodiment of this invention include the following:

a) the hydrophilic material applied to the receptacle and the hydrophilic material used to coat the objects should be insoluble in the assembly or carrier fluid;

b) the hydrophilic material applied to the receptacle should preferentially wet the receptacles in the assembly or carrier fluid, and the hydrophilic material coated on the objects must selectively wet the small assemblies in the assembly fluid;

c) the objects are preferably coated because when liquid films are used there is a tendency of the objects to stick to one another due to capillary forces.

In the preferred embodiment of the invention, the receptacle(s) on the substrate is treated with a substance which is an unpolymerized precursor or a monomer of a solid polymer. The unpolymerized precursor or monomer is placed in or on the receptacle sites by selective wetting and this is accomplished by wetting techniques known in the art. It is preferred that the unpolymerized precursor or monomer wet the receptacles but not the substrate surrounding the receptacles. Preferably the unpolymerized precursor or monomer of the solid polymer is a liquid.

The object to be affixed to the receptacle is coated with a hydrophilic material that is an initiator of a polymerization reaction or is a hardener. The terms "initiator" and "hardener" are used interchangeably herein, and these materials initiate the polymerization reaction. When the coated object self-locates to the receptacle, and it contacts the liquid precursor or monomer, the object will align itself and adhere due to capillary forces. The contact between the coated object and the liquid precursor or monomer initiates the polymerization reaction. The combination of the unpolymerized monomer and precursor and the initiator or hardener form an adhesive which locks or affixes the object in place.

The unpolymerized precursor or monomer on the receptacle and the initiator coated on the object should be immiscible with the carrier fluid, and the surface energy of the initiator of the polymerization reaction should be lower in the unpolymerized precursor than in the carrier fluid. It is preferred that the unpolymerized precursor or monomer be a polar fluid. A preferred precursor is a cyanoacrylate such as methylcyanoacrylate or ethylcyanoacrylate. Cyanoacrylates undergo anionic polymerization in the presence of weak bases such as water. The term "OH radical" (i.e., $OH^{31}$) as used herein symbolizes a weak base. Other examples of weak bases are ammonia ($NH_3$), amines (R—$NH_2$), alcohols (R—OH), and ethers (R—O—R'), where R denotes an organic group (e.g., methyl ($CH_3$—), ethyl ($C_2H_5$—), etc.). Glass or $SiO_2$ surfaces left out in air are usually terminated with Si—OH. This surface is weakly basic, and initiates the polymerization reaction in one embodiment of the invention.

There are other compounds beside cyanoacrylates that can be used for the monomer so long as such compounds can initiate a polymerization reaction during the self-assembly process. Other approaches that require external means or extra steps such as UV exposure, pulsed heating, or the addition of a chemical initiator are disadvantageous for reasons discussed previously. An advantage of cyanoacrylates is that water or other weak bases on the surfaces of the components being assembled initiate the polymerization reaction.

A variant of the cyanoacrylate and trace water embodiment is an embodiment wherein the surfaces of the components to be assembled are specifically pre-loaded with a weakly basic functional group. This embodiment improves the reliability of the adhesion process by ensuring the presence of an initiator, as next discussed.

A consideration in using cyanoacrylate, which is polymerized by very weak bases, as the adhesive is that either $OH^-$ or $H_2O$ may be present on almost any hydrophilic surface unless special precautions are taken. Water can be adsorbed from air onto these surfaces, or react with the surfaces to leave them terminated in $OH^-$, which will then initiate the polymerization reaction. One may take advantage of this property to omit any need to coat the components with a weak base. The components can comprise enough $OH^-$, adsorbed from air, to initiate the polymerization reaction when they come in contact with the cyanoacrylate adhesive in the receptacles. However, in using this technique, there is a drawback in that care must be taken to insure that the initiator is not present on the receptacle surfaces or that, if present, the amount present on the receptacle surfaces before the addition of the initiator is not sufficient to harden the cyanoacrylate.

To avoid the possibility that water from air will cause the cyanoacrylate to harden in the receptacles prior to assembly of the components, a preferred embodiment of the invention involves a separate step of treating the adhesion surface and the receptacles to provide surfaces with the required properties (rather than relying on reaction of the surfaces with trace amounts of water present in air). This preferred embodiment uses a cyanoacrylate as the adhesive, but entails deliberately treating the adhesive surface of the assembly object to attach the polar initiator, and treating the receptacles to insure that they are polar but that the polymerization reaction is not initiated before the addition of the initiator on the assembly object. Preparation of the adhesion surface of the assembly object may use an Au layer loaded with alkyl thiol molecules terminated in weak bases. Formation of the receptacles may use a similar process with the alkyl thiol molecules terminated in esters. Examples of weakly basic initiators for use in this preferred embodiment include molecules ending in amine (R—$NH_2$) or alcohol (R—OH) groups. One way to implement this embodiment is to deposit gold (Au) films on the underside of the components (about 1000Å) and then to react alkyl thiol compounds (HS $(CH_2)_n$—X, where X=$NH_2$ or OH and n=5–20) with the gold surface. Alkyl thiols may be applied to gold surfaces by mixing them with alcohols such as ethanol or methanol in a dilute form (<1%). The reaction of the alkyl thiol with gold may be performed at room temperature and may take about 24 hours for complete monolayer coverage of the surfaces. This process creates a gold surface that is functionalized with amine or alcohol initiators, which constitute the end groups of the thiol molecules attached to the Au surfaces. Coating of the components insures that the cyanoacrylate polymerization will proceed upon assembly.

In preparing hydrophilic receptacles, the surfaces of these receptacles may be coated with substances that neither initiate nor inhibit the polymerization reaction. An example of this is to use an Au surface to define the receptacle, then to use an ester terminated alkyl thiol molecule to coat the receptacles. This surface should be hydrophilic (due to the polar nature of the end group), but not basic enough to initiate the polymerization reaction.

Epoxides are another example of monomer compounds that may be used in this invention. These molecules also undergo anionic polymerization reactions that are initiated with the addition of moderately strong base compounds such as amines ($R-NH_2$) or sodium methoxide ($NaOCH_3$). In this embodiment, the epoxy compounds may be selectively coated on the surfaces of the receptacle sites and the components may be coated with the amine initiator compounds. The epoxy compounds employed in this case may be low-molecular-weight polymers. This enables the prepared epoxy compounds to have low viscosity. This embodiment is very similar to the cyanoacrylate embodiment, but requires a stronger base to initiate the polymerization reaction. (This embodiment has an advantage in that it is less likely that the receptacle surfaces would initiate the polymerization reaction due to unintended contamination of those surfaces with $OH^-$ due to reaction with trace amounts of water in the air.) Low-molecular weight epoxides allow thin coats to be applied to the receptacle surfaces. These can be further polymerized by a hardener consisting of a moderately strong base chemically attached to the adhesion surface of the assembly object.

The embodiments that use cyanoacrylates with $OH^-$ as an initiator can be performed at room temperature (i.e., about 15–25° C.), although it may in certain cases be beneficial to operate at temperatures other than room temperature for this and other embodiments. Reaction rates are usually a function of temperature and one may want to control the reaction rate by controlling the temperature. For example, one may want to slow down or speed up the reaction rate using temperature. There are, however, some requirements for temperature that should be maintained. The fluids should to be in the liquid state; the temperature should not be so high that the coatings decompose; and the temperature should be kept low to avoid combustion of the assembly fluid if certain alkanes are used for assembly (they have a finite flash point). There are non-polar alkanes and perfluorocarbons that are solid at room temperature that could also conceivably be used for the assembly fluid, but in general it is easier to use a similar compound with a smaller number of carbon atoms, which would behave similarly but is liquid at room temperature.

In a preferred embodiment, the initiator of the polymerization reaction or the hardener does not dissolve in or react with the carrier fluid. It should provide a high interfacial energy with respect to the carrier fluid. It should provide a surface that is preferentially wet with the liquid on the receptacle. Examples of such initiators are water or OH radicals.

The assembly or carrier fluid is a fluid capable of forming a slurry with the parts to be assembled. At a minimum the assembly or carrier should be immiscible with the adhesive. The assembly or carrier fluid may be a non-polar fluid such as liquid alkanes, perfluorinated alkanes or perfluorocarbons. Pentadecane or perfluoromethyldecaline can be used as the assembly or carrier fluid. The assembly process can also be carried out with a non-polar precursor, if the non-polar/polar nature of the surfaces, assembly fluid and initiator are also reversed.

To remove objects non-selectively adhering to the substrate large forces can be used because the correctly positioned objects are held in place very tightly. In the alternative, objects that did not properly adhere in the receptacle sites can be removed after the initial assembly step by withdrawing the assembly fluid.

FIG. 1 is a schematic of the assembly process in which hydrophilic receptacles 2, 4 in an Si substrate 6 are surrounded by an Au film 10 with a hydrophobic coating. The receptacles 2, 4 are selectively wet with cyanoacrylate adhesive 8 under a perfluorodecaline assembly fluid. Capillary forces due to the high perfluorodecaline/cyanoacrylate interfacial energy capture the hydrophilic glass beads 12, 14. The adhesive hardens after the glass bead capture due to a thin film of adsorbed water on the bead surface.

The method of this invention is illustrated by the following example which should not be construed to limit the scope of the invention.

EXAMPLE 1

Glass Beads Captured by Cyanoacrylate Filled Receptacles

A substrate was prepared with receptacles that were hydrophilic and the receptacles were separated by hydrophobic regions.

The receptacles which were approximately 20 μm deep were etched into the Si wafer using KOH with plasma etched silicon nitride forming a mask for the KOH etch step. After removing the nitride with hydrogen fluoride, chromium/gold layers were deposited over the wafer. The metal was then etched from the vicinity of the receptacles. The substrate was then treated with $H_2O_2$ to oxidize the exposed Si, making it hydrophilic. The substrate was then soaked overnight in a solution of hexadecane thiol in ethanol, which formed a hydrophobic layer on the surfaces still covered by gold.

The receptacles were then selectively wet with a cyanoacrylate adhesive. Several drops of ethyl cyanoacrylate adhesive (Loctite 420 with a viscosity of ≦5cP) were placed on the substrate. (A similarly low viscosity methylcyanoacrylate, Loctite 493, was used for other experiments). The substrate was then covered with the non-polar fluid perfluoromethyldecaline. In other experiments the non-polar liquid pentadecane was used. Perfluoromethyldecaline is denser than the cyanoacrylates, while pentadecane is less dense than the cyanoacrylates. The cyanoacrylate was then displaced from the surface of the substrate by swirling the perfluoromethyldecaline to push the cyanoacrylate to the edge of the wafer. A pipette was used to remove most of the excess cyanoacrylate. The polar cyanoacrylates preferentially wet the hydrophilic receptacles, leaving a pool of cyanoacrylate behind in the receptacles. In the hydrophobic regions, the perfluoromethyldecaline displaced the cyanoacrylate.

Figure 2:
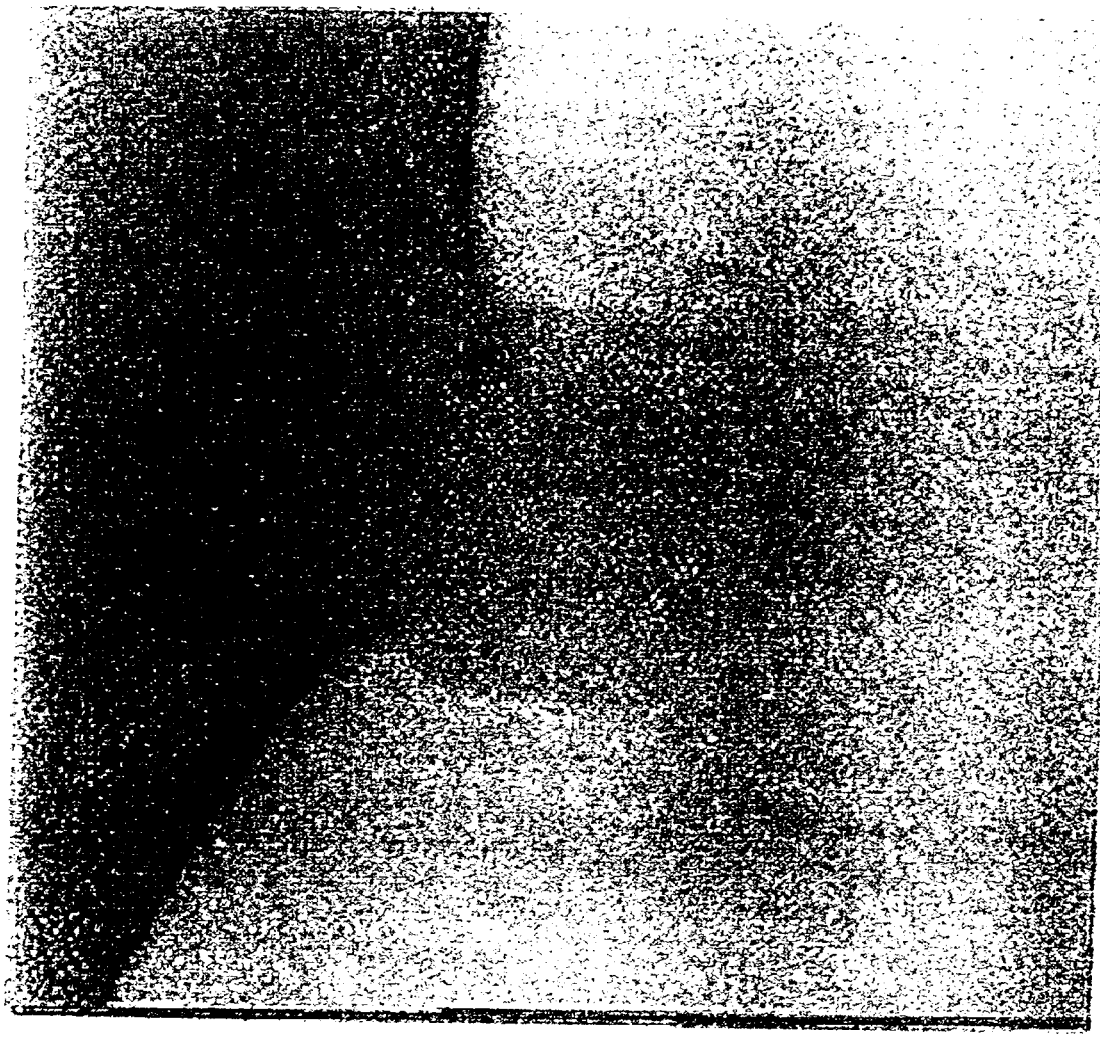
FIG. 2 shows the polymerizable material being displaced by the initiator of the polymerization reaction.

FIG. 2 shows a receding large drop of ethyl cyanoacrylate (left side of photo) being displaced by perfluoromethyldecaline. The square pad (55 μm on a side) in the center is oxidized Si, surrounded by hexadecanethiol treated Au. The cyanoacrylate preferentially wets the oxidized-Si pad, as shown by the meniscus connecting the fluid on the pad with the fluid in the large receding drop. For flat pads, occasionally droplets of cyanoacrylate were left behind. However, for most pads, the cyanoacrylate was either displaced entirely, or was too thin to be observed using an optical microscope.

Receptacles with a noticeable droplet of cyanoacrylate captured beads as they rolled over the pad. These beads were firmly glued to the pad after withdrawing the substrate from the assembly fluid. For pads without a noticeable droplet of cyanoacrylate, bead capture and adhesion were not observed.

Substrates with flat receptacles were also used for assembly experiments and uncoated 50 µm diameter glass beads were dropped into the perfluoromethyldecaline.

In order to leave more cyanoacrylate at the receptacles, the slightly recessed receptacles described above were used. The procedure described for the application of cyanoacrylate and its displacement by perfluoromethyldecaline was repeated. In this case, a much larger fraction of the receptacles captured glass beads. The substrate was withdrawn from the assembly fluid and a pipette filled with perfluormethyldecaline was used to rinse the substrate of excess beads. Beads captured in the receptacles stayed firmly attached during this procedure, indicating good adhesion.

Figure 3:
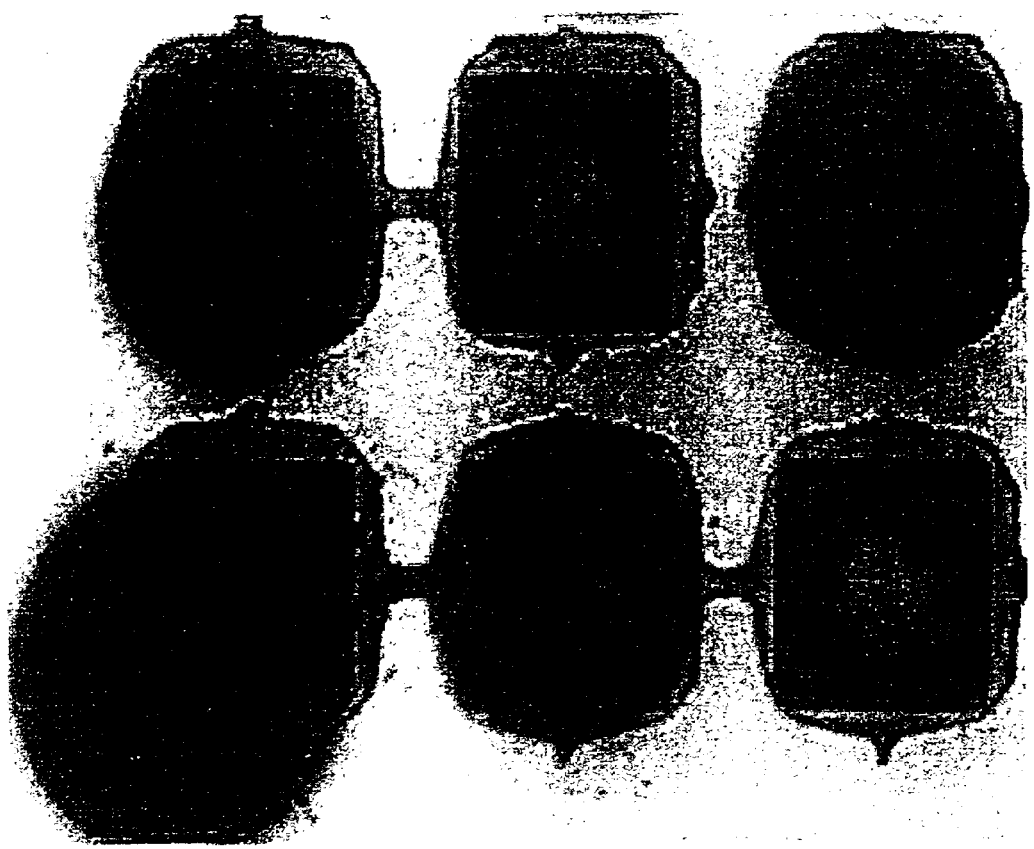
FIG. 3 shows glass beads self-located by fluid assembly and glued into shallow receptacles.
Figure 4:
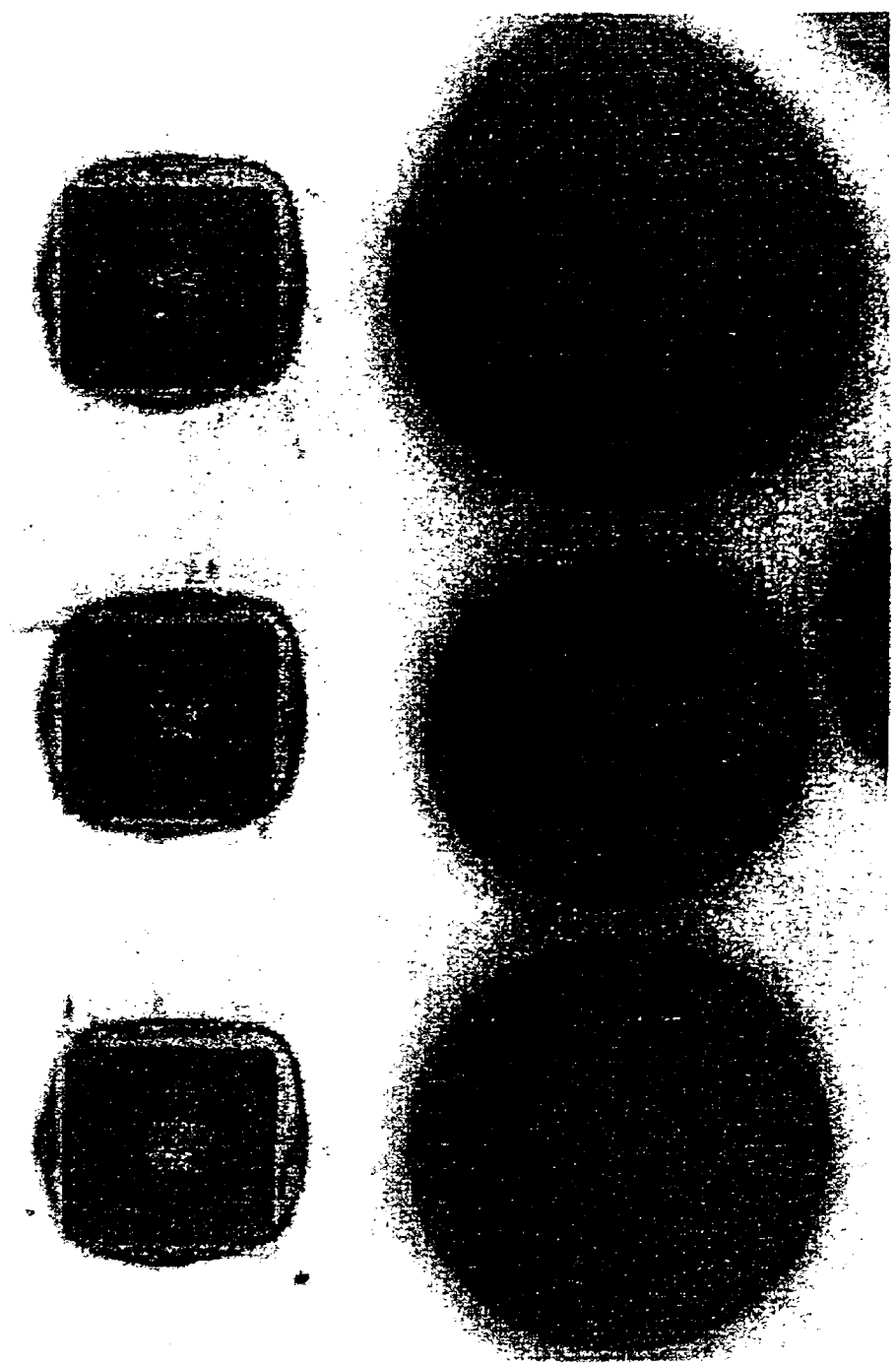
FIG. 4. shows glass beads self-located by fluid assembly.

FIGS. 3 and 4 show optical microscope pictures of assembled glass beads. In FIG. 3, 50 µm glass beads fill 4 of the 6 receptacles in which the receptacles are approximately 50 µm across. The glass bead in the lower left is clearly off-center. In general, off-center beads, particularly for larger receptacles, adhere to one corner of the receptacle.

FIG. 4 shows capture of the 50 µm diameter beads onto smaller receptacles (approximately 30 µm across). Centering of these beads was much better, as indicated by the linear arrangement of the three beads on the right of the photo. Better shape matching of the small objects and the receptacles should lead to improved centering during the self-location process.

Glass beads were used for these experiments because the size was appropriate for the receptacles, their surfaces are hydrophilic and they are easily obtained. The techniques described are not limited to objects of this shape.

While there have been shown and described specific embodiments of the present invention, further modification and improvements will occur to those skilled in the art. It should be understood, therefore, that this invention is not limited to the particular forms shown and that the appended claims are intended to cover all modifications that do not depart from the spirit and scope of this invention as defined by the following claims.

What is claimed is:

1. A method for assembling components on a substrate comprising
   (a) selectively coating at least a first receptor site of the substrate with a liquid precursor that forms a solid adhesive upon contact with an initiator;
   (b) providing each of the components with an adhesion surface that comprises the initiator; and
   (c) depositing the components on the substrate in a manner that causes a first of the components to contact the at least first receptor site whereupon contact between the initiator and the liquid precursor causes formation of the adhesive which affixes the first component to the first receptor site.

2. The method according to claim 1, wherein depositing the components comprises depositing a slurry comprising a carrier fluid and a plurality of the components onto the substrate, the precursor and the initiator being immiscible with the carrier fluid, the adhesion surface of each of the components having a lower surface energy in the precursor than in the carrier fluid.

3. The method according to claim 2, wherein the first receptor site has a surface that is hydrophilic and an area around the first receptor site is hydrophobic, or the first receptor site has a surface that is hydrophobic and the area around the first receptor site is hydrophilic, the adhesion surface of each of the components comprising a hydrophilic material that is attracted to the surface of the first receptor site if the surface of the first receptor site is hydrophilic, the adhesion surface of each of the components comprising a hydrophobic material that is attracted to the surface of the first receptor site if the surface of the first receptor site is hydrophobic.

4. The method according to claim 3, wherein the surface of the first receptor site is hydrophilic and the area around the first receptor site is hydrophobic, the surface of each of the components comprising the hydrophilic material.

5. The method according to claim 4, comprising prior to selectively coating at least a first receptor site, providing said substrate with a plurality of receptacles that are separated from one another by regions, treating the plurality of receptacles to render them hydrophilic and treating the regions to render them hydrophobic.

6. The method according to claim 5, wherein the precursor is a polar fluid and selectively coating at least a first receptor site comprises depositing the polar fluid and an assembly fluid onto a surface of the substrate so that the polar fluid preferentially wets the hydrophilic receptacles, and removing excess polar fluid from the surface of the substrate.

7. The method according to claim 6, wherein the polar fluid comprises a liquid cyanoacrylate monomer and the initiator comprises a base that, upon contact with the monomer, initiates a polymerization reaction to form a solid polymer.

8. The method according to claim 7, wherein the initiator comprises a base selected from the group consisting of ammonia, an amine, an alcohol and an ether.

9. The method according to claim 8, wherein the base is an alcohol of the formula R—OH or an amine of the formula R—$NH_2$.

10. The method according to claim 6, wherein the initiator is formed on the adhesion surface of each of the components by contact of the adhesion surface of each of the components with water present in ambient air.

11. The method according to claim 6, wherein the adhesion surface of each of the components comprises Si—OH.

12. The method according to claim 6, comprising coating said initiator onto the adhesion surface of each of the components.

13. The method according to claim 12, comprising depositing a gold film on each the components and then applying an alkyl compound of the formula $HS(CH_2)_nX$, wherein X=$NH_2$ or OH and n=5–20, to the gold film to form a gold surface that is functionalized with an amine or alcohol moiety.

14. The method according to claim 6, wherein the polar fluid comprises a liquid epoxide monomer and the initiator comprises a base that, upon contact with the monomer, initiates a polymerization reaction to form a solid polymer.

15. The method according to claim 14, wherein the base is an amine or sodium methoxide.

16. The method according to claim 6, wherein the substrate comprises silicon.

17. The method according to claim 16, wherein the plurality of receptacles are treated with hydrogen peroxide to oxidize the silicon to render it hydrophilic.

18. The method according to claim 3, wherein the precursor is a liquid monomer and the initiator initiates a polymerization reaction upon contact with the monomer to form a solid polymer.

19. The method according to claim 18, wherein the precursor is a cyanoacrylate monomer or an epoxide monomer.

20. The method according to claim 18, wherein the surface of the first receptor site is hydrophobic and the area around the first receptor site is hydrophilic, the adhesion surface of each of the first components comprising the hydrophobic material.

21. A method for assembling components on a substrate comprising:

(a) selectively coating at least a first receptor site of the substrate with a liquid precursor that forms a solid adhesive upon contact with an initiator;

(b) providing each of the components with at least one adhesion surface that comprises the initiator, wherein each of the components also have one or more non-adhesion surfaces without the initiator; and (c) depositing the components on the substrate in a manner that causes a first of the components to contact the at least first receptor site whereupon contact between the initiator and the liquid precursor causes formation of the adhesive which affixes the first component to the first receptor site.

22. A method for assembling components on a substrate comprising:

(a) selectively coating at least a first receptor site of the substrate with a liquid precursor that forms a solid adhesive upon contact with an initiator;

(b) providing each of the components with an adhesion surface that comprises the initiator; and (c) depositing the components on the substrate in a manner that causes a first of the components to contact the at least first receptor site whereupon contact between the initiator and the liquid precursor causes formation of the adhesive which affixes the first component to the first receptor site, wherein depositing the components comprises depositing a slurry comprising a carrier fluid and a plurality of the components onto the substrate, the precursor and the initiator being immiscible with the carrier fluid, the adhesion surface of each of the components having a lower surface energy in the precursor than in the carrier fluid, and wherein the carrier fluid comprises a different material than the initiator.

* * * * *